(12) United States Patent
Srinivasan et al.

(10) Patent No.: US 11,444,627 B1
(45) Date of Patent: Sep. 13, 2022

(54) SYNCHRONIZATION OF RECEIVER AND TRANSMITTER LOCAL OSCILLATORS FOR RANGING APPLICATIONS

(71) Applicant: Silicon Laboratories Inc., Austin, TX (US)

(72) Inventors: Rangakrishnan Srinivasan, Austin, TX (US); Michael Wu, Austin, TX (US); Francesco Barale, North Kingstown, RI (US); John Khoury, Austin, TX (US); Aslamali A. Rafi, Austin, TX (US)

(73) Assignee: Silicon Laboratories, Inc., Austin, TX (US)

( * ) Notice: Subject to any disclaimer, the term of this patent is extended or adjusted under 35 U.S.C. 154(b) by 0 days.

(21) Appl. No.: 17/549,314

(22) Filed: Dec. 13, 2021

(51) Int. Cl.
H03L 7/099 (2006.01)
G06F 1/08 (2006.01)
H03L 7/093 (2006.01)

(52) U.S. Cl.
CPC ............... *H03L 7/099* (2013.01); *G06F 1/08* (2013.01); *H03L 7/093* (2013.01)

(58) Field of Classification Search
CPC ............ H03L 7/099; H03L 7/093; G06F 1/08
See application file for complete search history.

(56) References Cited

U.S. PATENT DOCUMENTS

| | | | |
|---|---|---|---|
| 8,537,952 B1 * | 9/2013 | Arora | H03L 7/1974 375/376 |
| 9,712,176 B1 | 7/2017 | Rafi et al. | |
| 9,966,965 B2 | 5/2018 | Rafi et al. | |
| 10,581,436 B1 * | 3/2020 | Patel | H03K 21/026 |
| 11,271,550 B1 * | 3/2022 | Kossel | H03K 21/10 |
| 2007/0160164 A1 * | 7/2007 | Sahota | H03F 1/0205 375/295 |
| 2008/0129353 A1 * | 6/2008 | Lin | H03L 7/18 327/157 |
| 2014/0312936 A1 * | 10/2014 | Abdel-Haleem | H03K 23/54 327/118 |
| 2016/0308536 A1 * | 10/2016 | Cali | H03L 7/1974 |
| 2018/0054203 A1 * | 2/2018 | Drost | H03K 21/026 |
| 2018/0323792 A1 * | 11/2018 | Deng | H03K 3/35625 |
| 2020/0228125 A1 * | 7/2020 | Tertinek | H04B 1/403 |
| 2021/0390004 A1 * | 12/2021 | Kundu | G06F 9/545 |
| 2022/0004220 A1 * | 1/2022 | Ito | G06F 1/08 |
| 2022/0170968 A1 * | 6/2022 | Van Elzakker | G01K 7/32 |
| 2022/0200669 A1 * | 6/2022 | Banuli Nanje Gowda | H04B 7/0456 |
| 2022/0209777 A1 * | 6/2022 | Midha | H03L 7/0891 |

* cited by examiner

*Primary Examiner* — Adam D Houston
(74) *Attorney, Agent, or Firm* — Nields, Lemack & Frame, LLC

(57) ABSTRACT

A system and method for accurately determining a distance between two network devices using a Channel Sounding application is disclosed. The network devices each guarantee a fixed phase relationship between the transmit circuit and the receive circuit. In one embodiment, this is achieved by incorporating the divider within the phase locked loop. The divider may have a reset, such that it can be initialized to a predetermined state. Further, by utilizing a divider disposed within the phase locked loop with a reset, the quadrature signal generator is guaranteed to output clocks for the transmit circuit and the receive circuit that have a constant phase relationship.

19 Claims, 14 Drawing Sheets

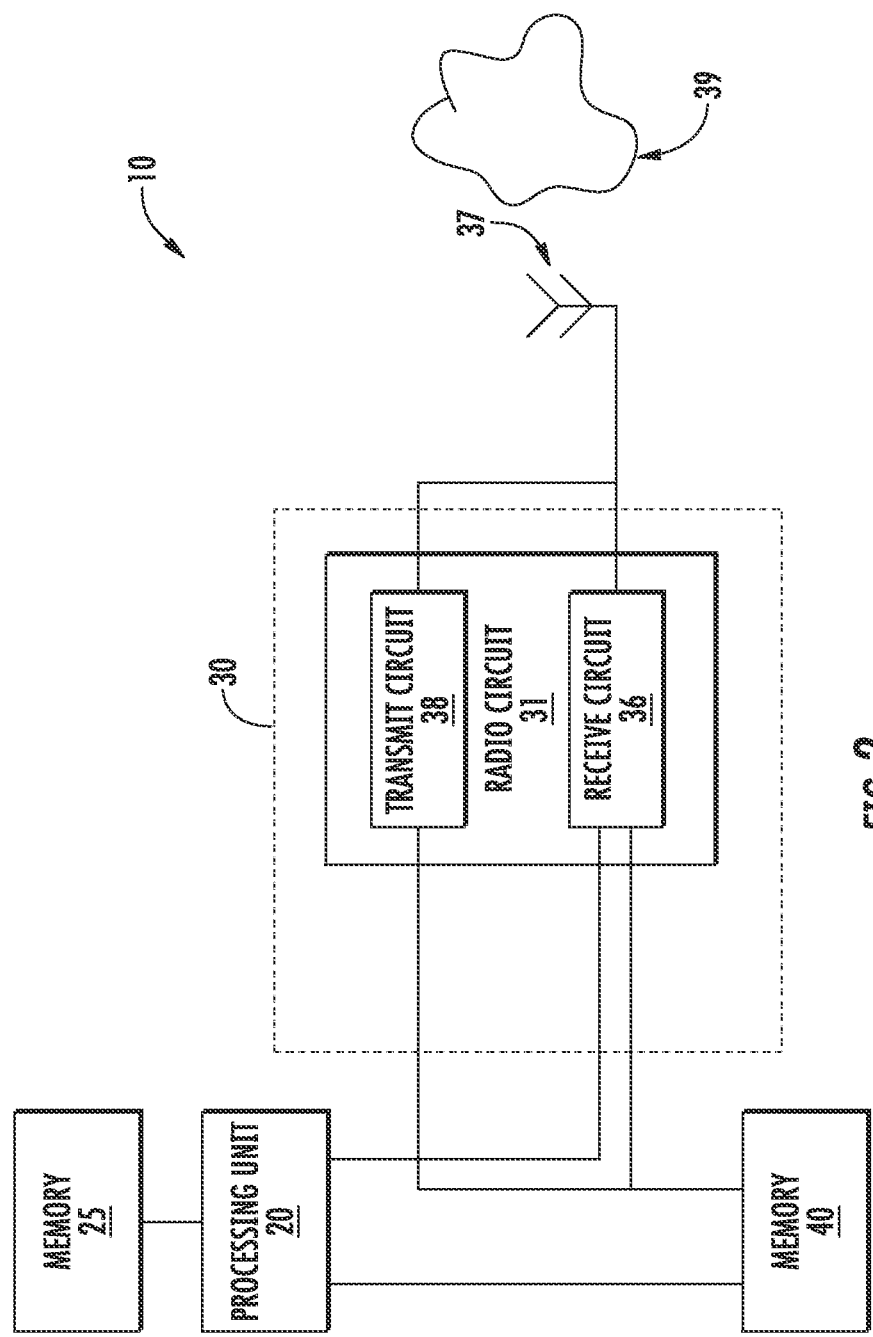

SYNCHRONIZATION OF RECEIVER AND TRANSMITTER LOCAL OSCILLATORS FOR RANGING APPLICATIONS

FIELD

This disclosure describes systems and methods for determining a distance between network devices, and more particularly for determining a distance by guaranteeing a constant phase delay between the transmit clock and the receive clock.

BACKGROUND

There is currently interest in expanding current network protocols to allow the possibility for a network device to determine the distance to another network device. For example, the Bluetooth specification is being modified to include distance measurements via the Channel Sounding (CS) feature. As currently proposed, Channel Sounding discloses basic measurement techniques for two-way ranging. Two-way ranging requires the establishment and maintenance of a network connection between an initiator and a reflector. Since a network connection is established, security can be provided.

FIG. 1 shows two network devices that may be used to perform a distance measurement for positioning using Channel Sounding. The first network device 100, may be referred to as the locator or initiator, while the second network device 110 may be referred to as the tag or reflector. In operation, the first network device 100 transmits a first packet to the second network device 110. After receiving the first packet from the initiator, the second network device 110 replies by transmitting a second packet to the first network device 100.

The second network device 110 may determine the phase of the signal that it received from the first network device. This phase has three components: the phase associated with the transmit circuit of the initiator, the phase associated with the receive circuit of the reflector and the phase delay associated with the distance between the two network devices. In other words, the phase received by the reflector may be expressed as:

$$\theta_1 = \theta_{I,T} - \theta_{R,R} + 2\pi f_1 t_p$$

where $\theta_{I,T}$ is the phase of the transmit circuit of the initiator; $\theta_{R,R}$ is the phase of the receive circuit of the reflector; $f_1$ is the frequency of the signal that was transmitted; and $t_p$ is the time for the signal to travel from the initiator to the reflector.

Similarly, the phase received by the initiator for the second packet can be expressed as:

$$\theta_2 = \theta_{R,T} - \theta_{I,R} 2\pi f_1 t_p$$

where $\theta_{R,T}$ is the phase of the transmit circuit of the reflector; $\theta_{I,R}$ is the phase of the receive circuit of the initiator; $f_1$ is the frequency of the signal that was transmitted; and $t_p$ is the time for the signal to travel from the reflector to the initiator.

Summing these values yields:

$$\varphi_{RT,f1} = \theta_1 + \theta_2 = (\theta_{I,T} - \theta_{I,R}) + (\theta_{R,T} \theta_{R,R}) + 4\pi f_1 t_p$$

If this sequence is performed at a second frequency, the result may be expressed as:

$$\varphi_{RT,f2} = \theta_1 + \theta_2 = (\theta_{I,T} - \theta_{I,R}) + (\theta_{R,T} - \theta_{R,R}) + 4\pi f_2 t_p$$

Subtracting these two expressions yields:

$$\varphi_{RT,f1} - \varphi_{RT,f2} = 4\pi(f_1 - f_2)t_p \text{ or } 4\pi(f_1 - f_2) * \frac{d}{c};$$

where d is the distance between the two network devices; and c is the speed of light.

Note that the above equation assumes that $(\theta_{I,T} - \theta_{I,R}) + (\theta_{R,T} - \theta_{R,R})$ is constant for the two frequencies. This relationship must apply to any of the frequencies that may be used by the Channel Sounding algorithm. Stated differently, the phase of the transmit circuit minus the phase of the receive circuit, or $\Theta_T - \Theta_R$, must be constant for both network devices. For example, if the quantity above varies, it may be difficult or impossible to accurately determine the distance between the two network devices. Similar constraints may also exist for one-way ranging applications, as well as any other phase based ranging applications.

Thus, it would be beneficial if there were a system that was capable of performing distance measurements using Channel Sounding with predictable results.

SUMMARY

A system and method for accurately determining a distance between two network devices using a Channel Sounding application is disclosed. The network devices each guarantee a fixed phase relationship between the transmit circuit and the receive circuit. In one embodiment, this is achieved by incorporating the divider within the phase locked loop. The divider may have a reset, such that it can be initialized to a predetermined state. Further, by utilizing a divider disposed within the phase locked loop with a reset, the quadrature signal generator is guaranteed to output clocks for the transmit circuit and the receive circuit that have a constant phase relationship.

According to one embodiment, a clock generation circuit is disclosed. The clock generation circuit comprises a signal source to provide a REFCLK signal; and a phase locked loop, comprising: a detector to determine a difference between the REFCLK signal and a feedback signal and provide an output based on the difference; a loop filter to filter the output to create a filtered output; an oscillator to generate a clock signal with a frequency related to the filtered output; a divider to divide the clock signal by a quantity; and a multi-modulus divider in communication with an output of the divider, to further divide the output of the divider and supply the feedback signal to the detector; wherein the divider comprises a reset signal so as to be initialized to a known state. In certain embodiments, the clock generation circuit comprises a quadrature signal generator in communication with the output of the divider. In some embodiments, the quadrature signal generator outputs a transmit clock and a receive clock, and wherein a phase difference between the transmit clock and the receive clock is constant. In some embodiments, the quadrature signal generator comprises a shift register. In some embodiments, the quadrature signal generator comprises combinational logic, wherein the shift register and the combinational logic are used to generate the receive clock and the transmit clock. In some embodiments, the receive clock output by the quadrature signal generator has a duty cycle of 12.5%, 25% or 50%. In some embodiments, the shift register is used to generate the transmit clock. In some embodiments, the transmit clock output by the quadrature signal generator has a duty cycle of 12.5%, 25% or 50%. In certain embodiments, the detector comprises a phase/frequency detector and charge pump; and the oscillator comprises a voltage-controlled oscillator and the output from the phase/frequency detector and charge pump and the loop filter is a voltage. In certain embodiments, the detector comprises a time to digital converter, the output from the loop filter comprises a digital word and the oscillator comprises a digital-controlled oscillator.

According to another embodiment, a method of performing a distance measurement between a first network device and a second network device is disclosed. The method comprises transmitting a first packet from the first network device to the second network device, using a first frequency; replying to the first packet by transmitting a second packet from the second network device to the first network device using the first frequency; transmitting a third packet from the first network device to the second network device using a second frequency, different from the first frequency; replying to the third packet by transmitting a fourth packet from the second network device to the first network device using the second frequency; and calculating a distance based on a phase received by the first network device and the second network device for each packet, the first frequency and the second frequency, wherein the first network device and the second network device each comprise a clock generation circuit to generate a receive clock and a transmit clock, wherein a phase difference between the transmit clock and the receive clock of each network device is constant. In certain embodiments, the clock generation circuit comprises: a signal source to provide a REFCLK signal; and a phase locked loop, comprising: a detector to determine a difference between the REFCLK signal and a feedback signal and provide an output based on the difference; a loop filter to filter the output to create a filtered output; an oscillator to generate a clock signal with a frequency related to the filtered output; a divider to divide the clock signal by a quantity; and a multi-modulus divider in communication with an output of the divider, to further divide the output of the divider and supply the feedback signal to the detector, wherein the receive clock and the transmit clock of each network device is generated from the output of the divider. In some embodiments, the divider comprises a reset signal so as to be initialized to a known state. In some embodiments, the detector comprises a phase/frequency detector and charge pump; and the oscillator comprises a voltage-controlled oscillator and the output from the phase/frequency detector and charge pump and the loop filter is a voltage. In some embodiments, the detector comprises a time to digital converter, the output from the loop filter comprises a digital word and the oscillator comprises a digital-controlled oscillator. In certain embodiments, the clock generation circuit further comprises a quadrature signal generator in communication with the output of the divider to generate the receive clock and the transmit clock.

According to another embodiment, a clock generation circuit is disclosed. The clock generation circuit comprises a receive clock generation circuit; a transmit clock generation circuit; and a signal source to provide a REFCLK signal; wherein the receive clock generation circuit and the transmit clock generation circuit each comprise: a phase locked loop, comprising: a detector to determine a difference between the REFCLK signal and a feedback signal and provide an output based on the difference; a loop filter to filter the output to create a filtered output; an oscillator to generate a clock signal with a frequency related to the filtered output; a divider to divide the clock signal by a quantity; and a multi-modulus divider in communication with an output of the divider, to further divide the output of the divider by an integer and supply the feedback signal to the detector; wherein the divider comprises a reset signal so as to be initialized to a known state; wherein the transmit clock is generated based on the output of the divider in the transmit clock generation circuit and the receive clock is generated based on the output of the divider in the receive clock generation circuit, and wherein a phase difference between the transmit clock and the receive clock is constant. In some embodiments, at least one of the detector of the receive clock generation circuit or the detector of the transmit clock generation circuit comprises a phase/frequency detector and charge pump; and the oscillator comprises a voltage-controlled oscillator and the output from the phase/frequency detector and charge pump and the loop filter is a voltage. In some embodiments, at least one of the detector of the receive clock generation circuit or the detector of the transmit clock generation circuit comprises a time to digital converter, the output from the loop filter comprises a digital word and the oscillator comprises a digital-controlled oscillator.

BRIEF DESCRIPTION OF THE DRAWINGS

For a better understanding of the present disclosure, reference is made to the accompanying drawings, in which like elements are referenced with like numerals, and in which:

FIG. 2 is a block diagram of a network device that may be used to perform the range detections described herein;

DETAILED DESCRIPTION

Figure 1:
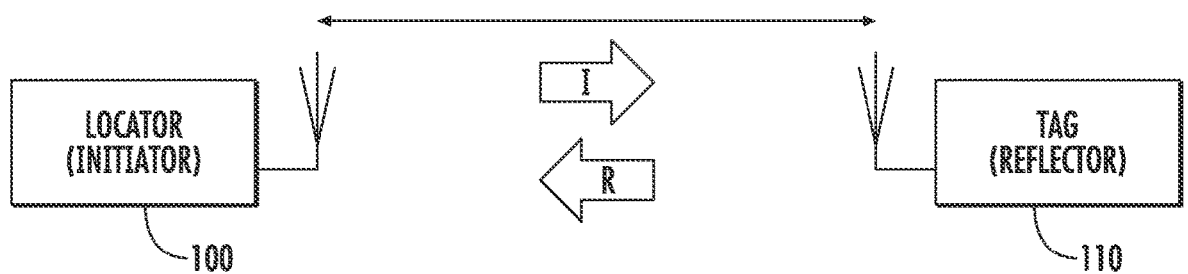
FIG. 1 shows a first network device and a second network device transmitting a range detection packet to each other.

FIG. 2 shows a network device that may be used to perform the range detection algorithm described herein. The network device 10 has a processing unit 20 and an associated memory device 25. The processing unit 20 may be any suitable component, such as a microprocessor, embedded processor, an application specific circuit, a programmable circuit, a microcontroller, or another similar device. The memory device 25 contains the instructions, which, when executed by the processing unit 20, enable the network device 10 to perform the functions described herein. This memory device 25 may be a non-volatile memory, such as a FLASH ROM, an electrically erasable ROM or other suitable devices. In other embodiments, the memory device 25 may be a volatile memory, such as a RAM or DRAM. The instructions contained within the memory device 25 may be referred to as a software program, which is disposed on a non-transitory storage media.

The network device 10 also includes a network interface 30, which may be a wireless network interface that includes an antenna 37. The network interface 30 may support any wireless network protocol that supports range detection, such as Bluetooth. The network interface 30 is used to allow the network device 10 to communicate with other devices disposed on the network 39.

The network interface 30 may include a radio circuit 31. This radio circuit 31 is used to process the incoming signal and convert the wireless signals to digital signals. The radio circuit 31 is also used to transmit outgoing signals. The components within the radio circuit 31 are described in more detail below.

The radio circuit 31 includes a receive circuit 36. The receive circuit 36 is used to receive, synchronize and decode the digital signals received from the antenna 37. Specifically, the receive circuit 36 has a preamble detector that is used to identify the start of an incoming packet. The receive circuit 36 also has a sync detector, which is used to identify a particular sequence of bits that are referred to as a sync character. Additionally, the receive circuit 36 has a decoder which is used to convert the digital signals into properly aligned bytes of data.

The radio circuit 31 also includes a transmit circuit 38. The transmit circuit 38 may include a power amplifier that is used to supply a signal to be transmitted to the antenna 37.

The network device 10 may include a second memory device 40. Data that is received from the network interface 30 or is to be sent via the network interface 30 may also be stored in the second memory device 40. This second memory device 40 is traditionally a volatile memory.

While a memory device 25 is disclosed, any computer readable medium may be employed to store these instructions. For example, read only memory (ROM), a random access memory (RAM), a magnetic storage device, such as a hard disk drive, or an optical storage device, such as a CD or DVD, may be employed. Furthermore, these instructions may be downloaded into the memory device 25, such as for example, over a network connection (not shown), via CD ROM, or by another mechanism. These instructions may be written in any programming language, which is not limited by this disclosure. Thus, in some embodiments, there may be multiple computer readable non-transitory media that contain the instructions described herein. The first computer readable non-transitory media may be in communication with the processing unit 20, as shown in FIG. 2. The second computer readable non-transitory media may be a CDROM, or a different memory device, which is located remote from the network device 10. The instructions contained on this second computer readable non-transitory media may be downloaded onto the memory device 25 to allow execution of the instructions by the network device 10.

While the processing unit 20, the memory device 25, the network interface 30 and the second memory device 40 are shown in FIG. 2 as separate components, it is understood that some or all of these components may be integrated into a single electronic component. Rather, FIG. 2 is used to illustrate the functionality of the network device 10, not its physical configuration.

Although not shown, the network device 10 also has a power supply, which may be a battery or a connection to a permanent power source, such as a wall outlet.

Figure 3A:
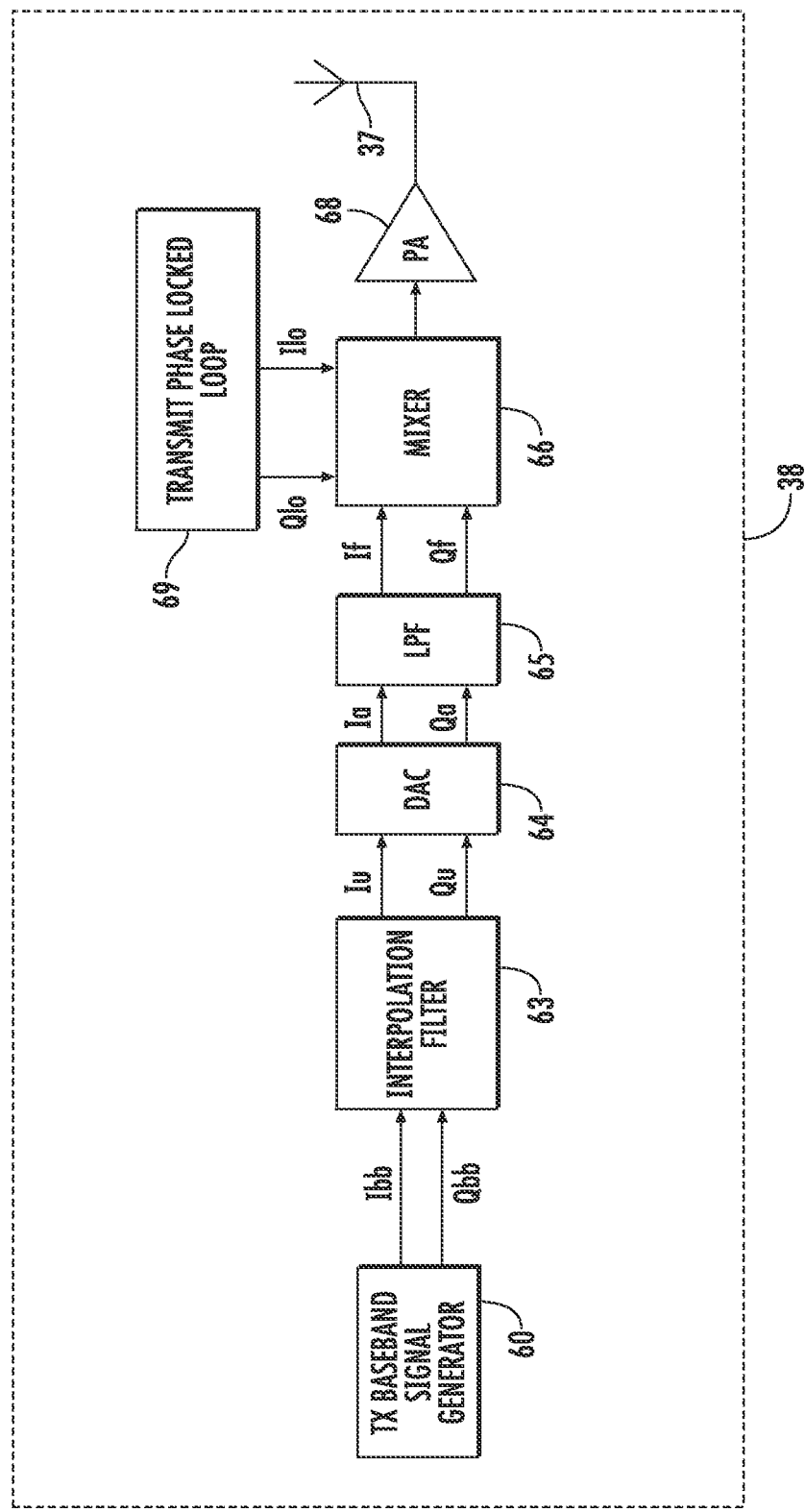
FIGS. 3A-3B show a block diagram of the transmit circuit of the network device of FIG. 2 according to two different embodiments.

FIG. 3A shows a first embodiment of a transmit circuit 38 that may be used to create two signals at two different frequencies where there is phase continuity between these signals during the frequency switch. The transmit circuit 38 includes the baseband signal generator 60, which is commonly used for all RF transmitters. The output of the baseband signal generator 60 may include two outputs, an in-phase output, Ibb, and a quadrature output, Qbb. Each output may enter an interpolation filter 63, which is used to upsample the waveforms. Following the interpolation filter 63 is the digital to analog converter (DAC) 64, which converts the digital data into an analog waveform. Following the DAC 64 may be a low pass filter (LPF) 65. The outputs of the LPF 65 then enter a mixer 66, which multiplies the outputs of the LPF 65 by $I_{lo}$ and $Q_{lo}$, respectively. The carrier frequency may be generated by the transmit phase locked loop 69. These two components are then summed. This composite signal then enters the power amplifier (PA) 68, and is transmitted by antenna 37.

Figure 3B:
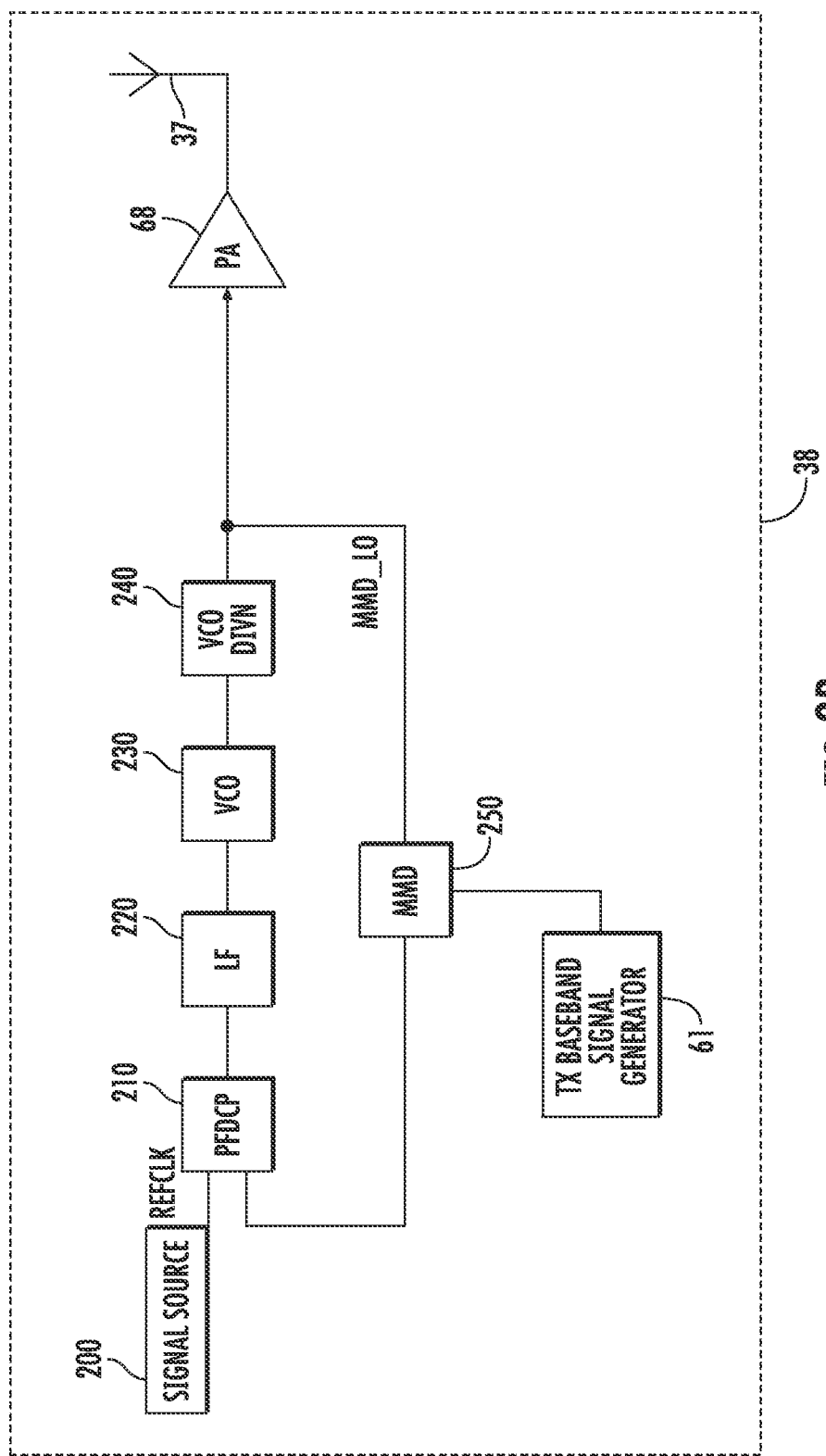

FIG. 3A shows the linear I-Q based upconversion architecture for both amplitude and constant envelope modulation schemes. Direct transmit modulation with the PLL is another architecture and is shown in FIG. 3B. In FIG. 3B, like components have been given identical reference designators. In this embodiment, the baseband signal generator 61 provides inputs to the phase locked loop. FIG. 3B shows a phase locked loop that includes a signal source 200, a phase/frequency detector and charge pump (PFDCP) 210, a loop filter (LF) 220, a voltage-controlled oscillator (VCO) 230, a divider 240 and a multi-modulus divider (MMD) 250. Each of these components is described in more detail below. The baseband signal generator 61 drives the MMD 250 for one-port modulation. The output of the phase locked loop is connected to the power amplifier (PA) 68 and works well for constant envelope modulation schemes.

Figure 4:
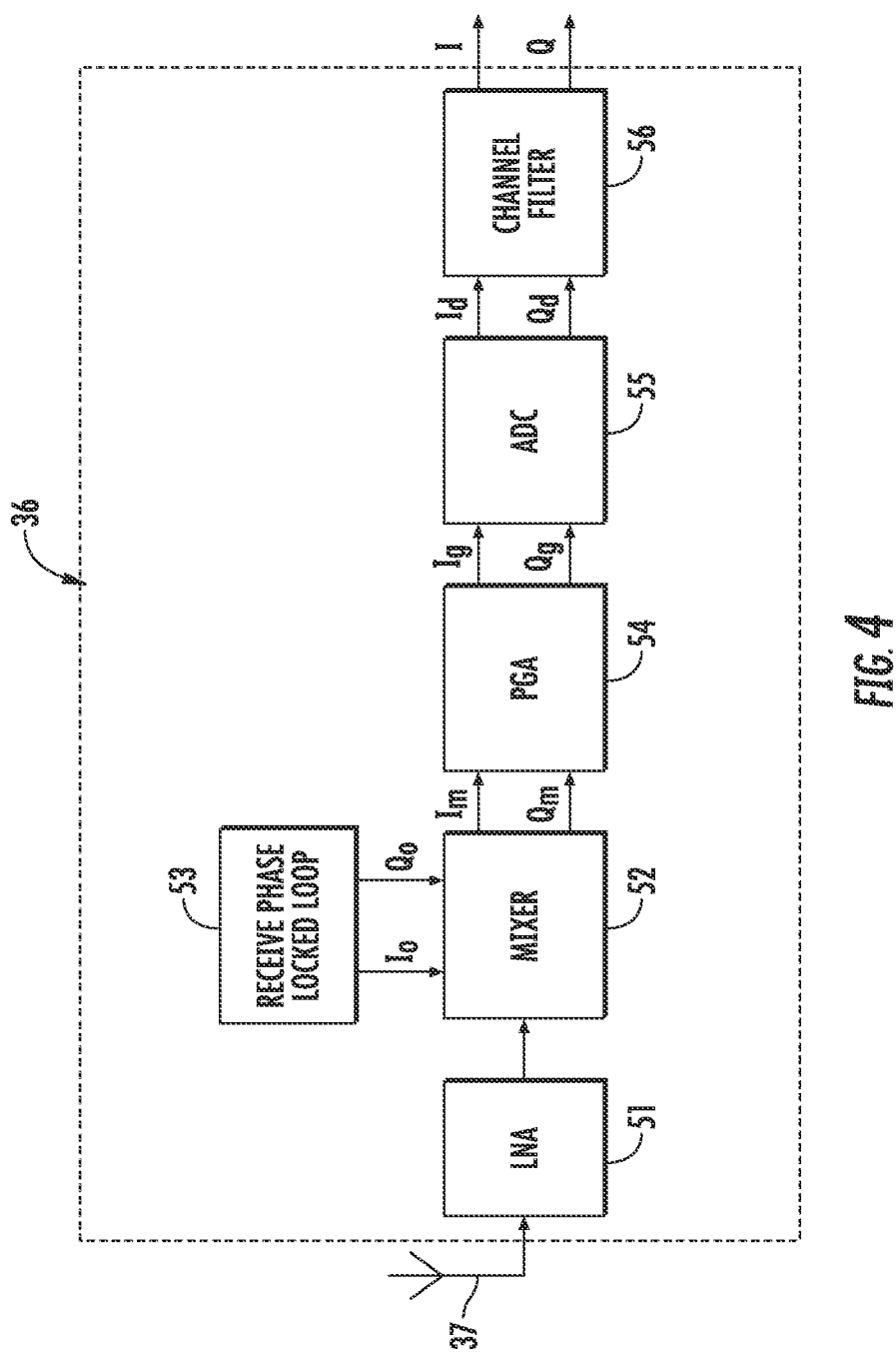
FIG. 4 is a block diagram of the radio receiver of the network device of FIG. 2.

FIG. 4 shows a block diagram of the receive circuit 36. The wireless signals first enter the receive circuit 36 through the antenna 37. This antenna 37 is in electrical communication with a low noise amplifier (LNA) 51. The LNA 51 receives a very weak signal from the antenna 37 and amplifies that signal while maintaining the signal-to-noise ratio (SNR) of the incoming signal. The amplified signal is then passed to a mixer 52. The mixer 52 is also in communication with a receive phase locked loop 53, which provides two phases to the mixer 52. The cosine of the frequency may be referred to as $I_o$, while the sine of the frequency may be referred to as $Q_o$. The $I_o$ signal is then multiplied by the incoming signal to create the in-phase signal, $I_m$. The $Q_o$ signal, delayed by 90° relative to the $I_o$ signal, is then multiplied with the incoming signal to create the quadrature signal, $Q_m$. The in-phase signal, $I_m$, and the quadrature signal, $Q_m$, from the mixer 52 are then fed into programmable gain amplifier (PGA) 54. The PGA 54 amplifies the $I_m$ and $Q_m$ signals by a programmable amount and may provide low pass filtering. These amplified and filtered signals are referred to as $I_g$ and $Q_g$. The amplified and filtered signals, $I_g$ and $Q_g$, are then fed from the PGA 54 into an analog to digital converter (ADC) 55. The ADC 55 converts these analog signals to digital signals, $I_d$ and $Q_d$. These digital signals may pass through channel filter 56 then exit the radio circuit 31 as I and Q. In certain embodiments, the I and Q values may be considered a complex number, wherein the I value is the real component and the Q value is the imaginary component.

The I and Q signals then enter a CORDIC (Coordination Rotation Digital Computer) or similar circuit, which determines the amplitude and phase of the signals. Amplitude is given as the square root of $I^2$ and $Q^2$, while phase is given by the $\tan^{-1}(Q/I)$. The CORDIC may be disposed in the radio circuit 31, or elsewhere within the network interface 30.

As described above, to accurately perform Channel Sounding calculations, it is necessary that $(\theta_{I,T}-\theta_{I,R})+(\theta_{R,T}-\theta_{R,R})$ is constant for the two frequencies. This may be achieved by guaranteeing a known relationship between the phase of the initiator transmit clock and the phase of the initiator receive clock and between the phase of the reflector transmit clock and the phase of the reflector receive clock. The transmit clock may be the output of the transmit phase locked loop 69. The receive clock may be the output of the receive phase locked loop 53.

Unfortunately, in most current implementations, there is phase ambiguity between the transmit circuit 38 and the receive circuit 36. This is often the result of independent dividers that are used in the transmit circuit 38 and the receive circuit 36 which divide the clock output from the phase locked loop for use within these respective blocks. Specifically, each time the network device is powered up, these dividers may power up in a different state, which results in an unknown phase relationship between the transmit clock and the receive clock.

One mechanism that may be used to achieve a known phase relationship is to use the same clock generation circuit for the transmit phase locked loop 69 in the transmit circuit 38 and the receive phase locked loop 53 in the receive circuit 36.

Figure 5A:
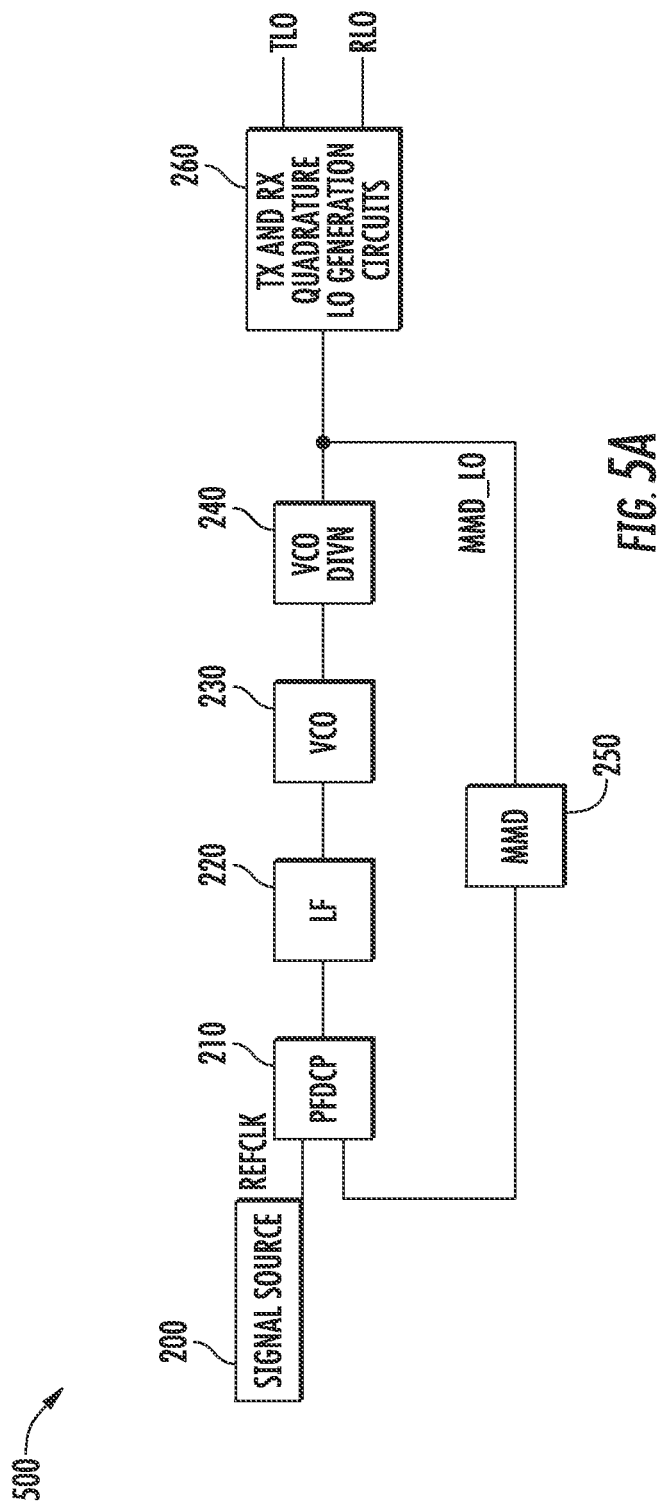
FIG. 5A shows the architecture of the phase locked loop according to one embodiment.

One such clock generation circuit 500 is shown in FIG. 5A. This circuit includes a signal source 200 that generates an input signal to phase/frequency detector and charge pump (PFDCP) 210. A variety of devices, circuits, or blocks may be used to implement signal source 200. Examples include a crystal (XTAL) oscillator, a resistor capacitor (RC) oscillator, an inductor capacitor (LC) oscillator, and other suitable devices. Generally, the signal source 200 outputs a REFCLK signal to the PFDCP 210. The PFDCP 210 receives a second input signal from the multi-modulus divider (MMD) 250.

The PFDCP 210 provides an output signal to loop filter (LF) 220. Loop filter (LF) 220 filters the signal received from PFDCP 210, and provides the resulting filtered signal to VCO 230. In other words, the output signal of loop filter (LF) 220 serves as the voltage control signal for VCO 230.

The voltage-controlled oscillator (VCO) 230 generates an output signal with a certain frequency, based on the input from the loop filter (LF) 220. In other words, the frequency of the output signal of VCO 230 depends on the voltage level of the control signal from loop filter (LF) 220. Thus, variations in the control signal from loop filter (LF) 220 cause corresponding changes in the frequency of the output signal of VCO 230.

Figure 5B:
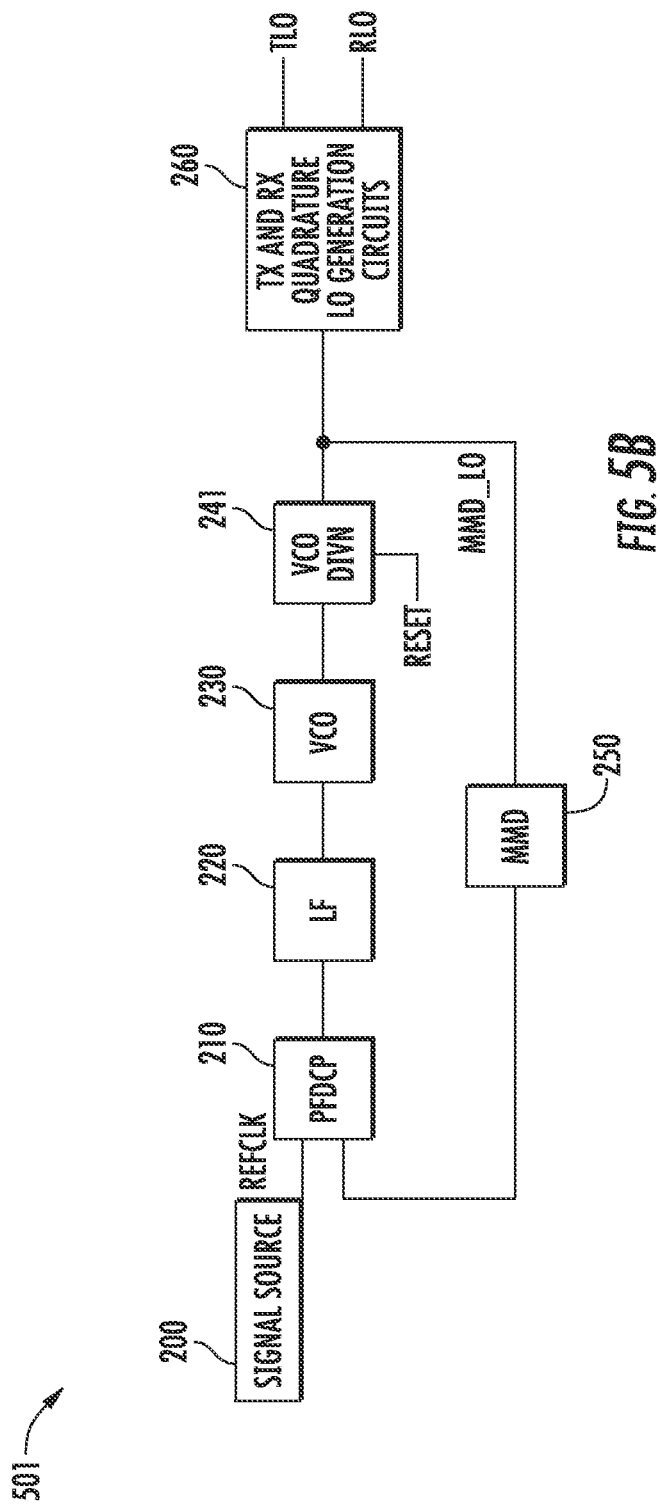
FIG. 5B shows the architecture of the phase locked loop according to a second embodiment.

While FIGS. 5A-5B show a VCO 230, other embodiments are also possible. For example, digital-controlled oscillators may also be employed for digital PLL implementations. In this embodiment, the phase/frequency detector and charge pump are replaced by a time-to-digital converter (TDC) and the loop filter has a digital output. In other words, the VCO is replaced by an L-C oscillator with a digital word from the loop filter in lieu of the control voltage. In a general sense, this applies to ring oscillator applications as well, and can be either a voltage-controlled or a current-controlled oscillator. Thus, in this embodiment, the voltage-controlled oscillator is replaced by an L-C oscillator and the output of the loop filter is changed accordingly. In all embodiments, there is a detector that compares the phase of the REFCLK and the feedback signal and creates an output based on this difference. This detector may be a phase/frequency detector and charge pump in analog PLLs or a TDC in digital PLLs. Additionally, in these embodiments, there is a loop filter that receives the output from the detector and generates a filtered output. This loop filter may output a voltage, which is used with a VCO, or the loop filter may output a digital word, which is used with a digital-controlled oscillator.

Further, other embodiments are possible. For example, a phase/frequency detector and charge pump may be utilized with a digitally controlled oscillator by inserting an analog-to-digital converter before the oscillator. Additionally, a TDC may be utilized with a voltage-controlled oscillator by inserting a digital to analog-converter before the oscillator.

The output signal of VCO 230 is then provided to divider 240. Divider 240 divides the frequency of the output signal of VCO 230 by a desired quantity. This quantity may be an integer, or may be N.5, where N is an integer. For example, in some embodiments, divider 240 may divide the frequency of the output signal of VCO 230 by four or by 2.5. In other embodiments, different integer divisors may be used. In certain embodiments, the use of N.5 dividers may help power amplifier (PA) to VCO coupling as the frequencies are not harmonically related.

The output signal of divider 240 serves as the input to the multi-modulus divider (MMD) 250. In some embodiments, the output from the divider 240 may be buffered before reaching the multi-modulus divider (MMD) 250. The multi-modulus divider (MMD) 250 may be implemented in a variety of ways. Furthermore, a variety of types of multi-modulus divider (MMD) 250 may be used, for example, dividers appropriate for use in a fractional-N frequency synthesizer. In other embodiments, different types or architectures of multi-modulus divider (MMD) 250 may be used. The multi-modulus divider (MMD) 250 divides the frequency of the output signal of divider 240 by a desired factor, which may be a fraction or integer, to generate an output signal that is provided as the second input to the PFDCP 210, as described above. Further, in certain embodiments, the multi-modulus divider (MMD) 250 is simply an integer divider.

The PFDCP 210, the loop filter (LF) 220, the VCO 230, the divider 240 and the multi-modulus divider (MMD) 250 form the phase locked loop. As described above, the phase locked loop may also be a digitally controlled loop. In each embodiment, the phase locked loop may comprise a detector, a loop filter, an oscillator, the divider 240 and the multi-modulus divider (MMD) 250.

In operation, the clock generation circuit attempts to minimize a phase difference between the REFCLK signal from the signal source 200 and the output of the multi-modulus divider (MMD) 250, also referred to as the feedback signal. In this way, the output of the divider 240 may be equal to Q*REFCLK, where Q is the divisor used by the multi-modulus divider (MMD) 250. The output from the VCO 230, also referred to as $F_{VCO}$, may be equal to N*Q*REFCLK, where N is the divisor used by the divider 240.

The output from the divider 240 is also provided as an input to the quadrature signal generator 260. The quadrature signal generator 260 generates one or more signals as its output signals. In the embodiment shown, quadrature signal generator 260 provides two sets of output signals, one set that is provided to receive circuit 36, and a second set that is provided to transmit circuit 38, although other numbers of output signals may be generated and used. For example, the first set of output signals may be the $I_o$ and $Q_o$ signals shown as the output of the receive phase locked loop 53 in FIG. 4. The second set of output signals may be the $I_{lo}$ and $Q_{lo}$ signals shown as the output of the transmit phase locked loop 69 in FIG. 3A.

Since the quadrature signal generator 260 utilizes only shift registers and combinational logic, the outputs of the quadrature signal generator 260 will always have a known phase difference. Moreover, the input to quadrature signal generator is phase-aligned with the reference clock, REFCLK, thereby avoiding any phase ambiguities. The quadrature signal generator 260 may be used to generate signals for both the receive circuit 36 and the transmit circuit 28. In other words, the transmit and receive quadrature generation circuits, disposed in the quadrature signal generator 260 and using the same shift registers, can provide the local oscillators for the transmit and receive mixers for upconversion and downconversion. In this embodiment, the clocks used by the receive circuit 36 and the transmit circuit 38 must utilize the same shift register within the quadrature signal generator 260.

As described in more detail below, the quadrature generation circuits may provide signals employing 50/25/12.5% duty cycle for 2-path/4-path/8-path mixers, where the $F_{VCO}$ is equal to 2 or 4 times the frequency of the local oscillator ($F_{LO}$). Of course, other embodiments are possible depending on the relationship between $F_{VCO}$ and $F_{LO}$. In general, $F_{VCO}=N*F_{LO}$, where N could be an integer or a fractional relationship. For example, if N is equal to 3, the duty cycle produced by the quadrature generation circuits may be 33%. Likewise, if N is 2.5, the duty cycle produced by the quadrature generation circuits may be 40%. Thus, the disclosure is not limited to a particular relationship between $F_{VCO}$ and $F_{LO}$ or a particular duty cycle.

FIG. 5B shows a second embodiment of the clock generation circuit 501. All like elements have been given identical reference designators and will not be described again. In this embodiment, the divider 241 has a reset signal. In this embodiment, the phase of the divider 241 is deterministic after the reset is released. This may reduce the settling time of the phase locked loop by keeping the initial phase difference between the REFCLK and the feedback signal small. While the reset signal is asserted, a known value is shifted through the multi-modulus divider (MMD) 250, such that when the reset is released, the output of the multi-modulus divider (MMD) 250 may be such that the phase between this output and the REFCLK signal is small. Specifically, the reset helps minimize the settling time, but is strictly not necessary for synchronization of the receive and transmit circuits. The phase ambiguities with respect to signal source 200 as described above are overcome by placing the divider 241 inside the PLL to provide an output that is phase-aligned to the REFCLK.

Additionally, the use of a reset signal for the divider 241 allows separate shift registers to be used in the quadrature signal generator 260, if desired. Specifically, while the reset signal is asserted, a known value is shifted through the shift registers in the quadrature signal generator 260, such that when the reset is released, the two shift registers will have the same state. In this way, the frequency of the clock signal for the receive circuit 36 may differ from the frequency of the clock signal of the transmit circuit 38. As an example, the clock for the transmit circuit 38 may be twice the frequency of the receive circuit 36.

Figure 6A:
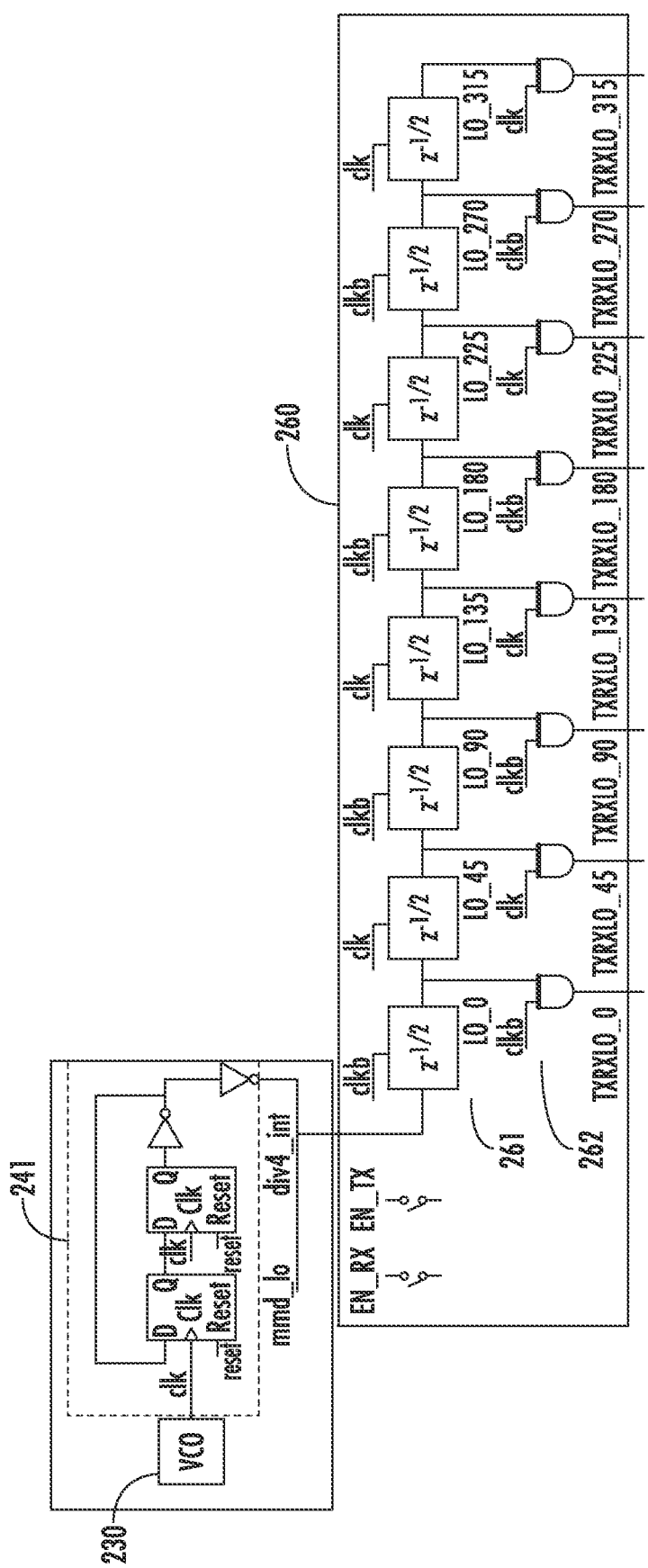
FIG. 6A shows the quadrature signal generator according to one embodiment.
Figure 6B:
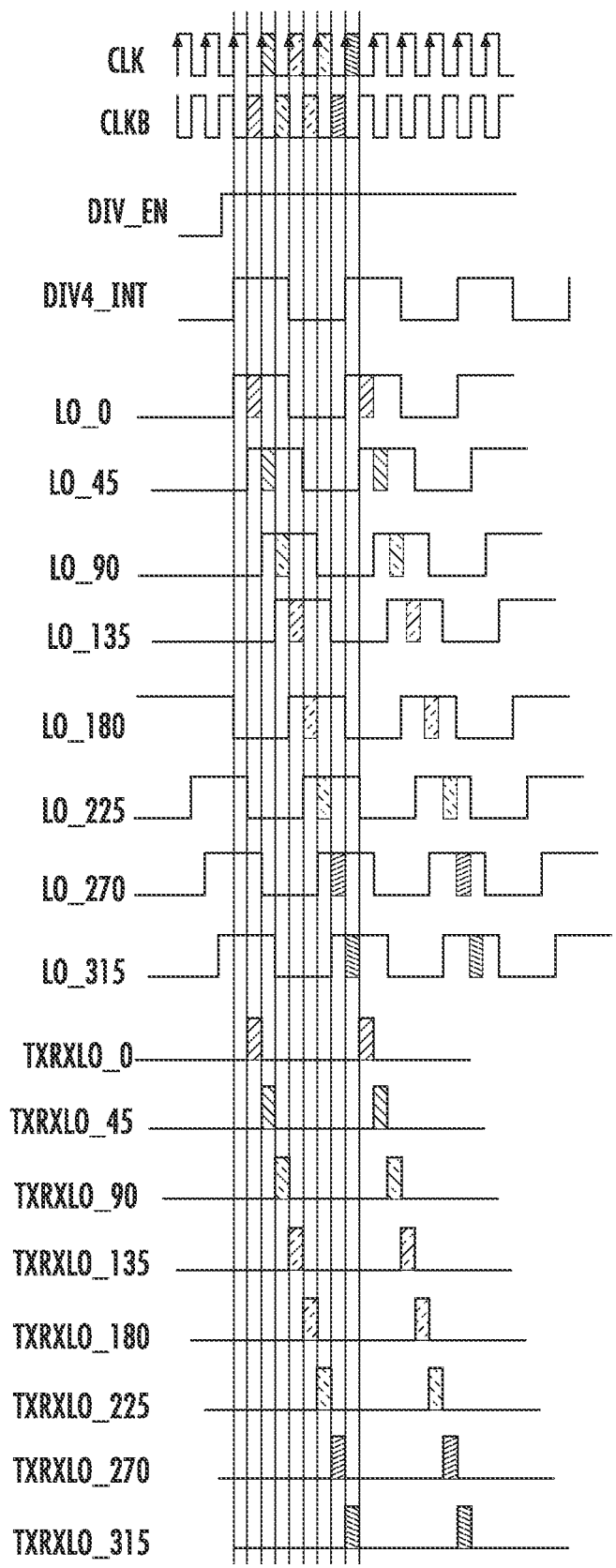
FIG. 6B shows the timing diagram associated with the quadrature signal generator of FIG. 6A.

FIG. 6A shows a first embodiment of a quadrature signal generator 260. In this embodiment, the VCO 230 and the divider 241 are also shown. The output of the VCO (clk) and its complement (clkb) are used to alternatively clock a shift register 261. The input to this shift register 261 is the output from the divider 241, which in this embodiment is a divide-by-4 circuit. The output from each stage of the shift register 261 also serves as a first input to an AND gate 262, where the second input is the clock that was used to clock the flip flop that generated that first input. The result of this is a set of signals, separated from one another by 45° and having a duty cycle of 12.5%. The timing diagram associated with this circuit is shown in FIG. 6B. Thus, in this embodiment, the VCO 230 operates at four times the frequency of the transmit clock and the receive clock.

Figure 7A:
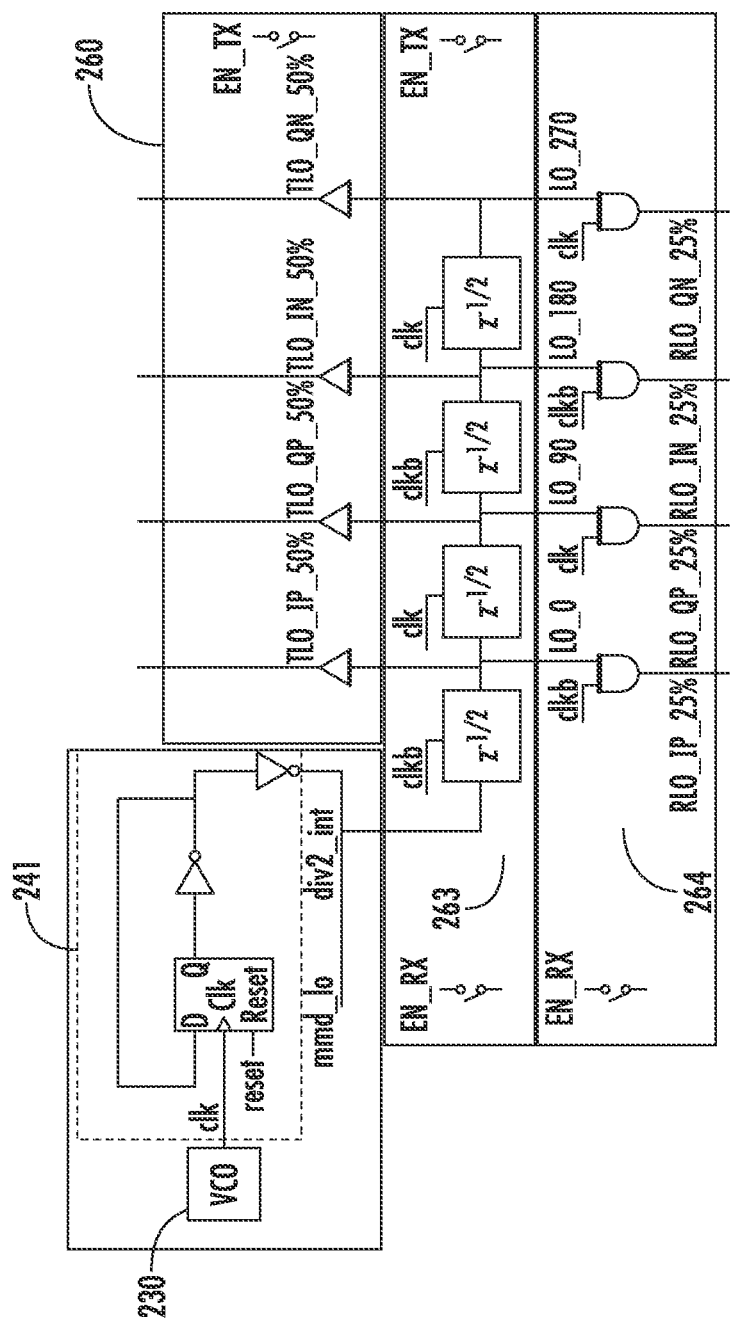
FIG. 7A shows the quadrature signal generator according to a second embodiment.

The quadrature signal generator 260 may have other configurations. For example, the divider 241 may be a divide-by-2 circuit. One such configuration is shown in FIG. 7A. In this configuration, the shift register 263 comprises 4 latches, which are alternatively clocked by the output from the VCO 230 (clk) and the complement of that signal (clkb). In this embodiment, the outputs from the latches in the shift register 263 are used directly as the transmit clocks; specifically, as the $I_{lo}$ and $Q_{lo}$ signals shown in FIG. 3A, as well as the complements of those signals. A plurality of AND gates 264 are used to create the signals for the receive circuit, which include the $I_o$ and $Q_o$ shown in FIG. 4, as well as their complements. Each signal has a duty cycle of 25%. The timing diagram for this configuration is shown in FIG. 7B.

Figure 7B:
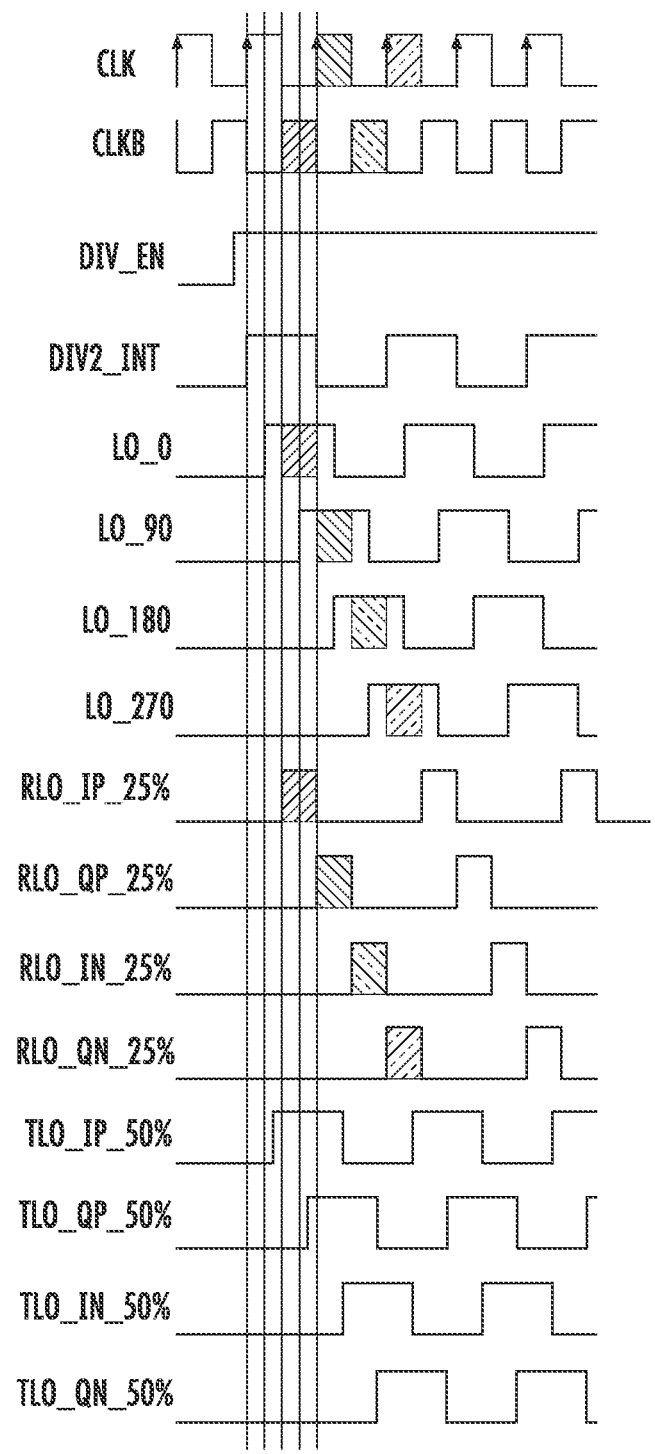
FIG. 7B shows the timing diagram associated with the quadrature signal generator of FIG. 7A.

Thus, as shown in FIGS. 7A-7B, the duty cycle of the transmit clock and the receive clock may be different. For example, the transmit clocks may be generated without the use of AND gates 264, and thus have a duty cycle that is twice that of the receive clocks.

Figure 8A:
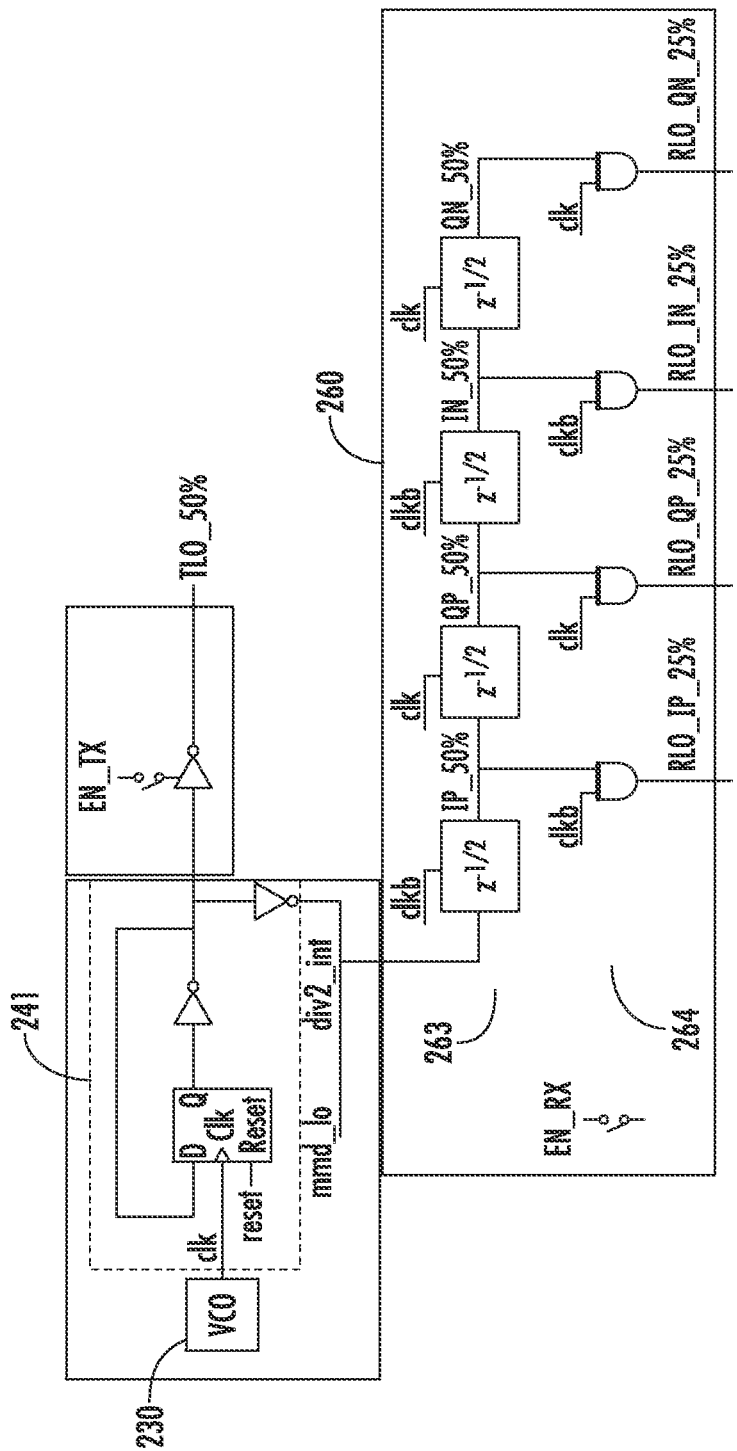
FIG. 8A shows the quadrature signal generator according to a third embodiment.
Figure 8B:
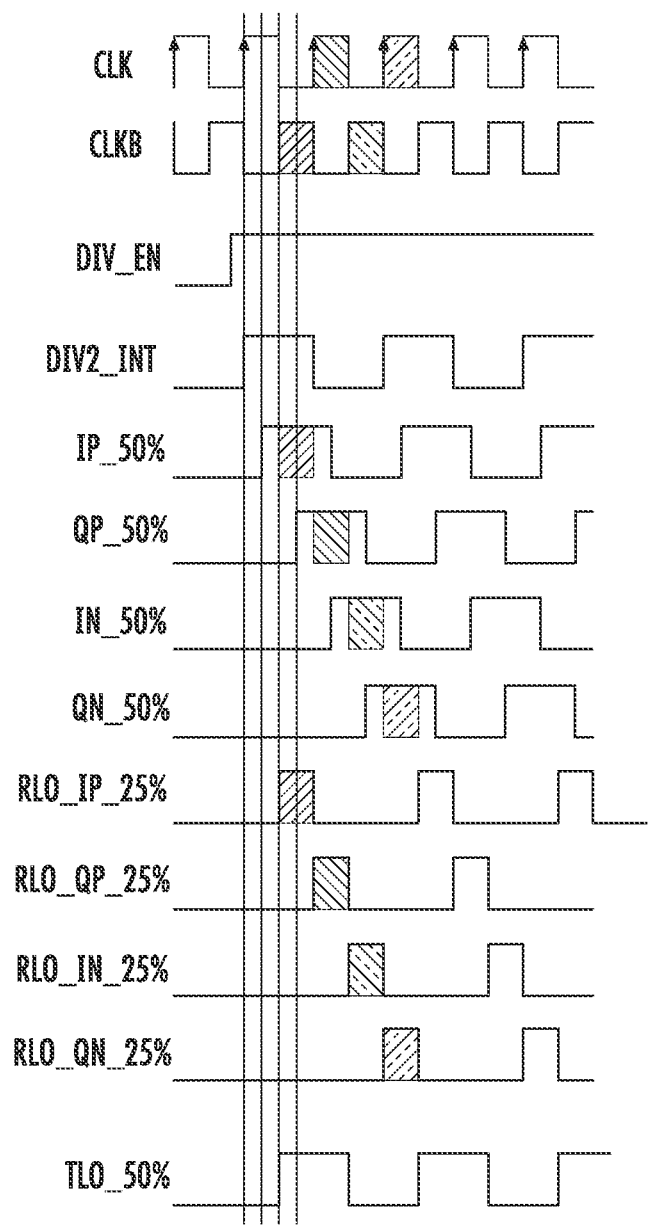
FIG. 8B shows the timing diagram associated with the quadrature signal generator of FIG. 8A.

Additionally, as shown in FIG. 8A, the transmit clock may not utilize the shift register. In this embodiment, the divider 241 is a divide-by-2 divider. The transmit clock may be generated directly from the output of the divider 241, while the receive clocks utilize the shift register 263 and AND gates 264 shown in FIG. 7A. A timing diagram of this configuration is shown in FIG. 8B. This technique is useful for direct transmit with PLL architectures, as shown in FIG. 3B.

Note that other embodiments are also possible. For example, the configurations shown in FIGS. 7A and 8A may be modified such that the divider 241 is a divide-by-4 divider. The rest of the circuit may be the similar as those in FIGS. 7A and 8A. The inputs to the AND gates 264 may differ to achieve a 25% duty cycle. While AND gates 264 are shown, it is noted that other combinational logic may be used. However, in all embodiments, non-ambiguous implementations with a shift register and combinational logic is possible.

The clock generation circuits shown in FIGS. 5A and 5B may be utilized in applications that are time division multiplexed, such that either the transmit circuit 38 is operating or the receive circuit 36 is operating at a particular point in time. Further, these clock generation circuits are applicable for both continuous mode and packet mode of operations. For completeness, the circuits in FIGS. 5A and 5B could also be applicable to full duplex operations, with the receive circuit 36 and the transmit circuit both operating at the same time and at the same carrier frequency.

However, in certain embodiments, the network protocol may utilize a frequency division multiplexing scheme where the receive circuit 36 and the transmit circuit 38 are both operating at the same time, but at different frequencies. Further, in certain embodiments, the network protocol may utilize simultaneous dual radio operation, where there are no constraints on the transmit and receive frequencies. All of these modes are supported by the clock generation circuit shown in FIG. 9 and described below.

Unfortunately, in most frequency division multiplexed implementations, there is phase ambiguity between the transmit circuit 38 and the receive circuit 36. This is the result of utilizing two different phase locked loops with dividers which can power up in any of a number of different states. Specifically, each time the network device is powered up, these dividers may power up in a different state, which results in an unknown relationship between the transmit clock and the receive clock.

Figure 9:
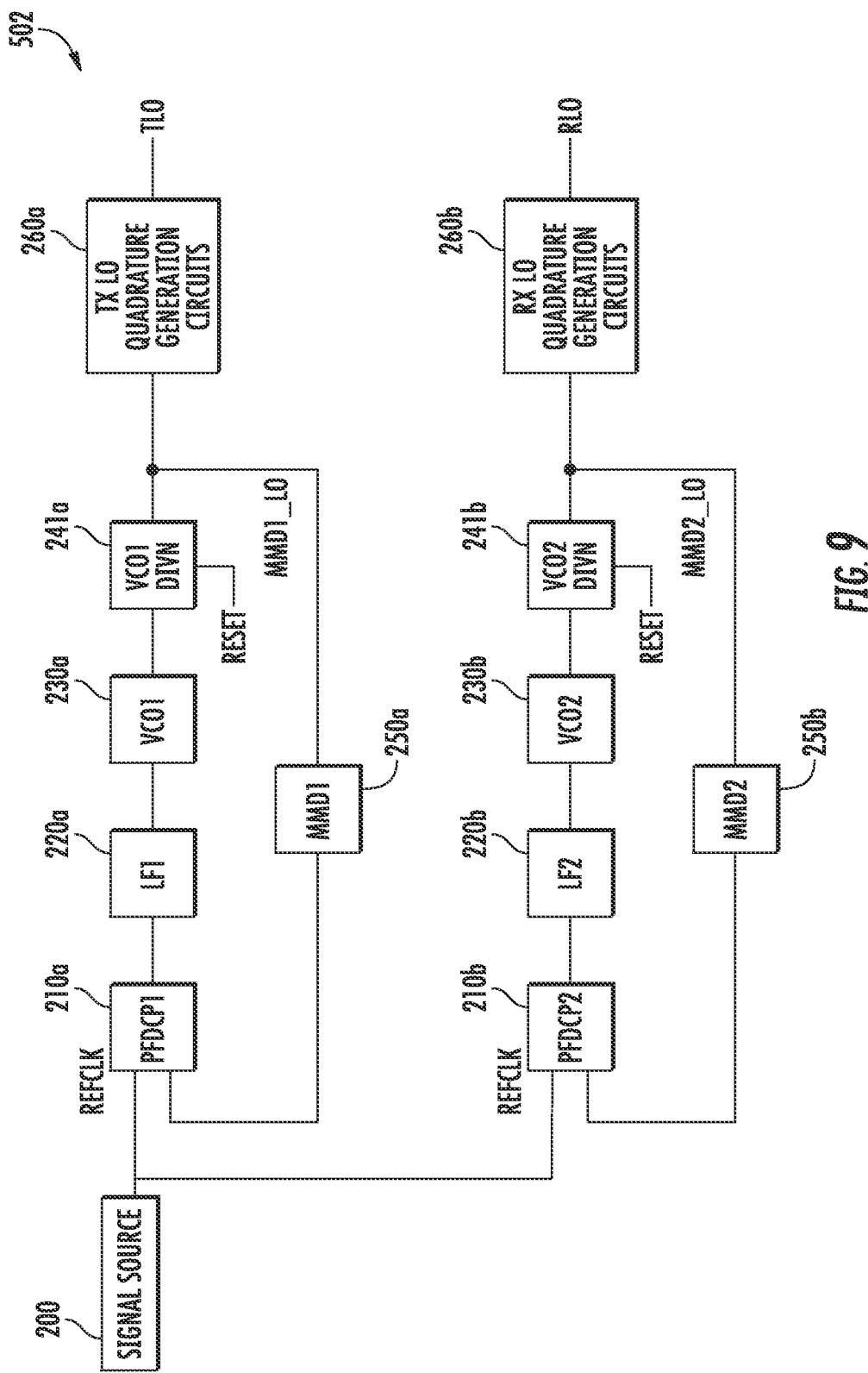
FIG. 9 shows the architecture of the phase locked loop according to a third embodiment.

FIG. 9 shows a clock generation circuit 502 that may be utilized in frequency division multiplexed applications. In this embodiment, the signal source 200 is used to drive two separate clock generation circuits, where each clock generation circuit is similar to clock generation circuit 501, shown in FIG. 5B. The transmit clock generation circuit comprises a PFDCP 210a, a loop filter (LF) 220a, a VCO 230a, a divider 241a, a MMD 250a. These components are as described above. The output of the divider 241a is also used as the input to the transmit quadrature signal generator 260a.

Likewise, the receive clock generation circuit comprises a PFDCP 210b, a loop filter (LF) 220b, a VCO 230b, a divider 241b, a MMD 250b. The output of the divider 241b is also used as the input to the receive quadrature signal generator 260b.

Note that in some embodiments, the two circuits may utilize phase locked loops having the same architecture. However, in other embodiments, the architecture of the two circuits may differ. For example, one may implement an analog PLL while the other may implement a digital PLL. Thus, one may include a phase/frequency detector and charge pump, while the other includes a TDC.

In this embodiment where there are separate clock generation circuits, the MMDs 250a,250b are both integer dividers. The divider 241a and the divider 241b may both be reset at initialization using the same reset signal. In other embodiments, separate reset signals may be used as long as they ensure phase alignment of the dividers. In this way, the outputs of the dividers have a known relationship to one another. Further, the divider 241a and the divider 241b may divide the signal from the respective VCO by the same integer, or by different integers. For example, the divider 241a may divide the VCO output by M while the divider 241b may divide the VCO output by N, where M and N may be the same or different quantities, such as integers or N.5 where N is an integer.

The two quadrature signal generators may be configured according to any of the embodiments described above. For example, the receive quadrature signal generator 260b may generate signals having a 12.5%, a 25% or a 50% duty cycle. The transmit quadrature signal generator 260a may generate signals having a 12.5%, a 25% or a 50% duty cycle. Generally, other implementations for duty cycle generation are possible depending on the relationship, $F_{VCO}=N*F_{LO}$, where N could be an integer or even a fractional relationship, such as, for example, N=2.5. However, in all embodiments, non-ambiguous implementations with a shift register and combinational logic is possible.

Each of the configurations shown herein ensures a constant offset between the clocks used in the transmit circuit 38 and the receive circuit 36. In this way, the Channel Sounding procedure may be executed with a guarantee that the calculations will be accurate. Thus, in one embodiment, a Channel Sounding calculation is performed using two network devices, which both contain one of the clock generation circuits described in FIGS. 5A-5B or FIG. 9. A first of the network devices transmits a first packet to the second network device, using a first frequency. The second network device then replies to the first packet by transmitting a second packet to the first network device using the first frequency. The first network device then transmits a third packet to the second network device using a second frequency, different from the first frequency. The second network device then replies to the third packet by transmitting a fourth packet to the first network device using the second frequency. Because of the use of the clock generation circuits described herein, $(\theta_{I,T}-\theta_{I,R})$ is a constant for the first network device and $(\theta_{R,T}-\theta_{R,R})$ is a constant for the second network device. Therefore, the distance between the two devices may be calculated reliably.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A clock generation circuit, comprising:
   a signal source to provide a REFCLK signal; and
   a phase locked loop, comprising:
      a detector to determine a difference between the REFCLK signal and a feedback signal and provide an output based on the difference;
      a loop filter to filter the output to create a filtered output;
   an oscillator to generate a clock signal with a frequency related to the filtered output;
      a divider to divide the clock signal by a quantity; and
      a multi-modulus divider in communication with an output of the divider, to further divide the output of the divider and supply the feedback signal to the detector;
      wherein the divider comprises a reset signal so as to be initialized to a known state.

2. The clock generation circuit of claim 1, further comprising a quadrature signal generator in communication with the output of the divider.

3. The clock generation circuit of claim 2, wherein the quadrature signal generator outputs a transmit clock and a receive clock, and wherein a phase difference between the transmit clock and the receive clock is constant.

4. The clock generation circuit of claim 3, wherein the quadrature signal generator comprises a shift register.

5. The clock generation circuit of claim 4, wherein the quadrature signal generator comprises combinational logic, wherein the shift register and the combinational logic are used to generate the receive clock and the transmit clock.

6. The clock generation circuit of claim 5, wherein the receive clock output by the quadrature signal generator has a duty cycle of 12.5%, 25% or 50%.

7. The clock generation circuit of claim 4, wherein the shift register is used to generate the transmit clock.

8. The clock generation circuit of claim 7, wherein the transmit clock output by the quadrature signal generator has a duty cycle of 12.5%, 25% or 50%.

9. The clock generation circuit of claim 1, wherein the detector comprises a phase/frequency detector and charge pump; and the oscillator comprises a voltage-controlled oscillator and the output from the phase/frequency detector and charge pump and the loop filter is a voltage.

10. The clock generation circuit of claim 1, wherein the detector comprises a time to digital converter, the output from the loop filter comprises a digital word and the oscillator comprises a digital-controlled oscillator.

11. A method of performing a distance measurement between a first network device and a second network device, comprising:
 transmitting a first packet from the first network device to the second network device, using a first frequency;
 replying to the first packet by transmitting a second packet from the second network device to the first network device using the first frequency;
 transmitting a third packet from the first network device to the second network device using a second frequency, different from the first frequency;
 replying to the third packet by transmitting a fourth packet from the second network device to the first network device using the second frequency; and
 calculating a distance based on a phase received by the first network device and the second network device for each packet, the first frequency and the second frequency,
  wherein the first network device and the second network device each comprise a clock generation circuit to generate a receive clock and a transmit clock, wherein a phase difference between the transmit clock and the receive clock of each network device is constant.

12. The method of claim 11, wherein the clock generation circuit comprises:
 a signal source to provide a REFCLK signal; and
 a phase locked loop, comprising:
 a detector to determine a difference between the REFCLK signal and a feedback signal and provide an output based on the difference;
 a loop filter to filter the output to create a filtered output;
 an oscillator to generate a clock signal with a frequency related to the filtered output;
 a divider to divide the clock signal by a quantity; and
 a multi-modulus divider in communication with an output of the divider, to further divide the output of the divider and supply the feedback signal to the detector, wherein the receive clock and the transmit clock of each network device is generated from the output of the divider.

13. The method of claim 12, wherein the divider comprises a reset signal so as to be initialized to a known state.

14. The method of claim 12, wherein the detector comprises a phase/frequency detector and charge pump; and the oscillator comprises a voltage-controlled oscillator and the output from the phase/frequency detector and charge pump and the loop filter is a voltage.

15. The method of claim 12, wherein the detector comprises a time to digital converter, the output from the loop filter comprises a digital word and the oscillator comprises a digital-controlled oscillator.

16. The method of claim 12, wherein the clock generation circuit further comprises a quadrature signal generator in communication with the output of the divider to generate the receive clock and the transmit clock.

17. A clock generation circuit comprising:
 a receive clock generation circuit;
 a transmit clock generation circuit; and
 a signal source to provide a REFCLK signal;
 wherein the receive clock generation circuit and the transmit clock generation circuit each comprise:
 a phase locked loop, comprising:
  a detector to determine a difference between the REFCLK signal and a feedback signal and provide an output based on the difference;
  a loop filter to filter the output to create a filtered output;
  an oscillator to generate a clock signal with a frequency related to the filtered output;
  a divider to divide the clock signal by a quantity; and
  a multi-modulus divider in communication with an output of the divider, to further divide the output of the divider by an integer and supply the feedback signal to the detector;
 wherein the divider comprises a reset signal so as to be initialized to a known state;
 wherein the transmit clock is generated based on the output of the divider in the transmit clock generation circuit and the receive clock is generated based on the output of the divider in the receive clock generation circuit, and wherein a phase difference between the transmit clock and the receive clock is constant.

18. The clock generation circuit of claim 17, wherein at least one of the detector of the receive clock generation circuit or the detector of the transmit clock generation circuit comprises a phase/frequency detector and charge pump; and the oscillator comprises a voltage-controlled oscillator and the output from the phase/frequency detector and charge pump and the loop filter is a voltage.

19. The clock generation circuit of claim 17, wherein at least one of the detector of the receive clock generation circuit or the detector of the transmit clock generation circuit comprises a time to digital converter, the output from the loop filter comprises a digital word and the oscillator comprises a digital-controlled oscillator.

* * * * *